United States Patent
Gruber et al.

(10) Patent No.: US 12,170,526 B2
(45) Date of Patent: Dec. 17, 2024

(54) SEMICONDUCTOR DEVICES, TRANSCEIVER, BASE STATION AND MOBILE DEVICE

(71) Applicant: Intel Corporation, Santa Clara, CA (US)

(72) Inventors: Daniel Gruber, St. Andrae (AT); Kameran Azadet, San Ramon, CA (US); Martin Clara, Santa Clara, CA (US); Marc Jan Georges Tiebout, Finkenstein (AT)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 18/054,628

(22) Filed: Nov. 11, 2022

(65) Prior Publication Data

US 2023/0198542 A1    Jun. 22, 2023

(30) Foreign Application Priority Data

Dec. 16, 2021 (EP) .................................... 21215064

(51) Int. Cl.
*H03M 1/66* (2006.01)
*H03D 7/16* (2006.01)
*H04B 1/00* (2006.01)
*H04B 1/04* (2006.01)

(52) U.S. Cl.
CPC .............. *H03M 1/66* (2013.01); *H03D 7/165* (2013.01); *H04B 1/0007* (2013.01); *H04B 1/04* (2013.01); *H04B 2001/045* (2013.01)

(58) Field of Classification Search
CPC ..... H03M 1/66; H04B 1/04; H04B 2001/045; H04B 1/0007; H03D 7/165
USPC ........................................................ 341/144
See application file for complete search history.

(56) References Cited

U.S. PATENT DOCUMENTS

| 9,020,011 | B1 * | 4/2015 | Hiebert ................. H04B 17/20 375/150 |
| 2003/0132868 | A1 | 7/2003 | Clausen et al. |
| 2006/0067425 | A1 | 3/2006 | Windisch |
| 2019/0383924 | A1 | 12/2019 | Mehdizad Taleie et al. |

\* cited by examiner

*Primary Examiner* — Khai M Nguyen
(74) *Attorney, Agent, or Firm* — 2SPL Patent Attorneys PartG mbB; Kieran O'Leary

(57) ABSTRACT

A semiconductor device comprising at least one transmit path is provided. The transmit path comprises an input node for receiving a digital baseband signal. Further, the transmit path comprises digital mixer circuitry coupled to the input node and configured to generate an upconverted digital baseband signal by upconverting a frequency of the digital baseband signal. Additionally, the transmit path comprises Digital-to-Analog Converter (DAC) circuitry coupled to the digital mixer circuitry and configured to generate an analog radio frequency signal based on the upconverted digital baseband signal. The transmit path comprises first analog mixer circuitry coupleable to an output of the DAC circuitry, and second analog mixer circuitry coupleable to the output of the DAC circuitry. Further, the transmit path comprises a first output node coupleable to an output of the first analog mixer circuitry, and a second output node coupleable to an output of the second analog mixer circuitry.

15 Claims, 14 Drawing Sheets

SEMICONDUCTOR DEVICES, TRANSCEIVER, BASE STATION AND MOBILE DEVICE

CROSS-REFERENCE TO RELATED APPLICATION

This application claims priority to European Application 21215064.3, filed on Dec. 16, 2021. The content of this earlier filed application is incorporated by reference herein in its entirety.

BACKGROUND

Radio Frequency (RF)-Sampling data converters are primarily optimized for direct RF conversion with a single RF input or output. However, usage in higher frequency applications such as millimeter wave (mmWave) requiring external mixing often needs an input/output IQ pair of converters. This can be solved by using one converter for I and one converter for Q at the expense of halving the number of antennas supported by the device, wasting valuable resources (e.g., converters, Digital Front-End, DFE, chains).

Conventional products have a dedicated approach for mmWave, where a pair of lower speed converters are used. Using an RF-sampling device optimized for direct RF conversion for Zero Intermediate Frequency (ZIF) applications wastes half of the resources of the expensive product as described above.

Hence, there may be a demand for improved transmit and receive structures.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
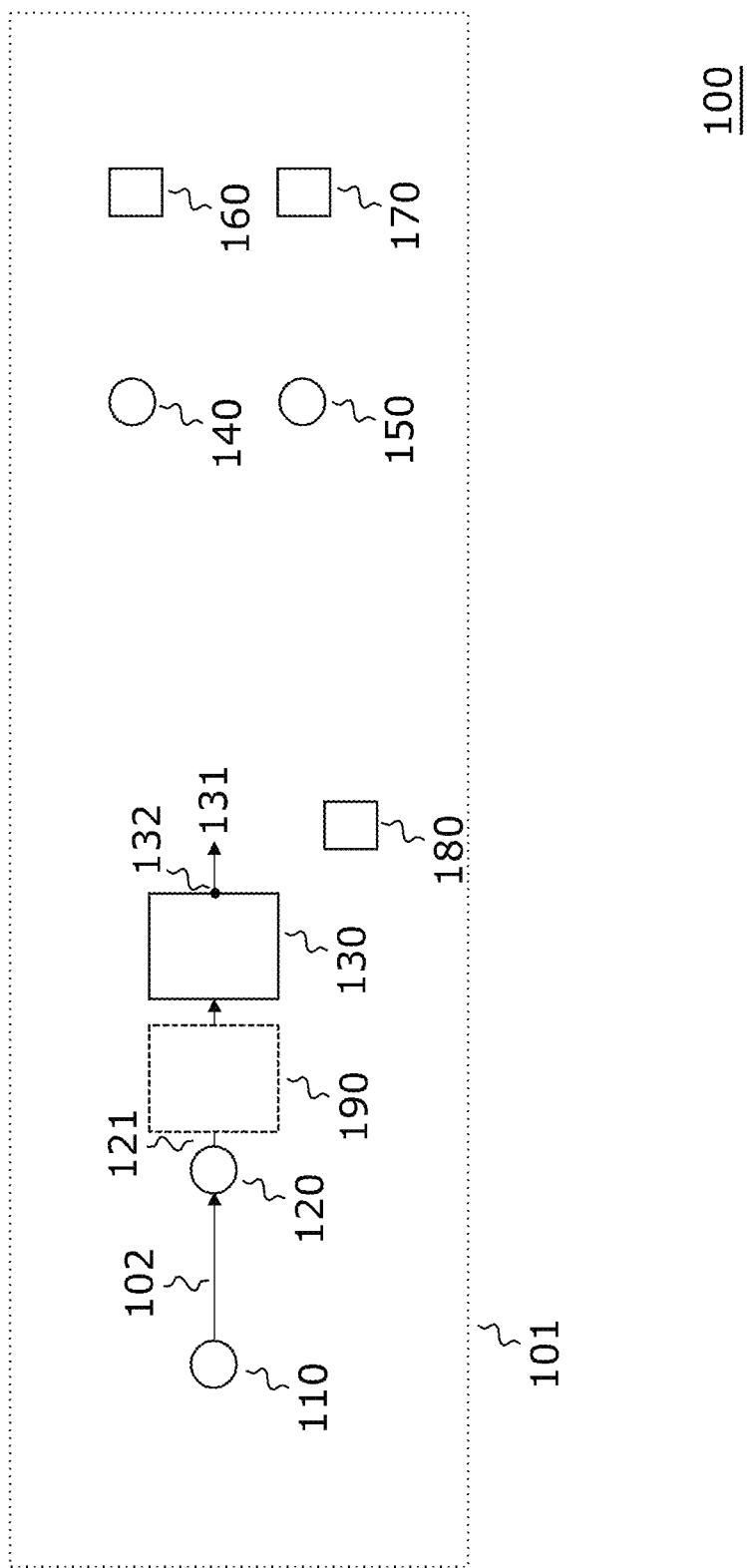
FIG. 1 illustrates an example of a semiconductor device comprising at least one transmit path.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of a semiconductor device 100. The semiconductor device 100 comprises at least one transmit path 101 (i.e. one or more transmit path 101) as illustrated in FIG. 1. In some examples, the semiconductor device 100 may comprise exactly one transmit path 101 as illustrated in FIG. 1. In other examples, the semiconductor device 100 may comprise a plurality of transmit paths 101. The semiconductor device 100 may, e.g., be a semiconductor die, a semiconductor chip or a semiconductor package (comprising one or more semiconductor die or chip holding the circuitry described below).

The transmit path 101 comprises an input node (terminal) 110 for receiving a digital baseband signal 102. Additionally, the transmit path 101 comprises digital mixer circuitry 120 coupled to the input node 101. The digital mixer circuitry 120 is configured to generate an upconverted digital baseband signal 121 by upconverting a frequency (center frequency) of the digital baseband signal 102. In other words, the digital mixer circuitry 120 shifts the original (center) frequency of the digital baseband signal 102 to a higher (center) frequency for generating the upconverted digital baseband signal 121. The center frequency of the digital baseband signal 102 may, e.g., be 0 Hz. However, it is to be noted that the present disclosure is not limited thereto. In other examples, the center frequency of the digital baseband signal 102 may be non-zero. For example, the center frequency of the digital baseband signal 102 may be less than 5 Hz, 10 Hz or 20 Hz. The mixer circuitry 120 may, e.g., be configured to combine the digital baseband signal 102 with another signal exhibiting a non-zero center frequency for upconverting the frequency of the digital baseband signal 102.

In addition, the transmit path 101 comprises Digital-to-Analog Converter (DAC) circuitry 130 coupled to the digital mixer circuitry 120. The DAC circuitry is configured to generate an analog RF signal 131 based on the upconverted digital baseband signal 121. The DAC circuitry 130 may be a high-speed data converter. Hence, the DAC circuitry 130's sample rate may be at least 1 Giga Samples Per Second (GSPS). For example, the DAC circuitry 130's sample rate may be 4 GSPS, 8 GSPS, 12 GSPS, 16 GSPS or more. However, it is to be noted that the present disclosure is not limited thereto. In other examples, DAC circuitry 130's sample rate may take other values. For example, the DAC circuitry 130's sample rate may be less than 1 GSPS. The (center) frequency of the upconverted digital baseband signal 121 may be in the first Nyquist zone, i.e., a value of the upconverted digital baseband signal 121's (center) frequency may be half of a value of the sample rate of the DAC circuitry 130 or smaller. For example, the value of the upconverted digital baseband signal 121's (center) frequency may be quarter of the value of the DAC circuitry 130's sample rate. However, it is to be noted that the present disclosure is not limited thereto. In other examples, the value of the upconverted digital baseband signal 121's (center) frequency may take other values.

Optionally, in case the digital baseband signal 102 and, hence, the upconverted digital baseband signal 121 is a complex signal, the transmit path 101 may further comprise digital filter circuitry 190 coupled between the digital mixer circuitry 120 and the DAC circuitry 130. The digital filter circuitry 190 is configured to filter the upconverted digital baseband signal 121 to provide only the real part of the upconverted digital baseband signal 121 to the DAC circuitry 130. In other words, the digital filter circuitry 190 is configured to remove or at least attenuate the imaginary part of the upconverted digital baseband signal 121.

The transmit path 101 further comprises first analog mixer circuitry 140 and second analog mixer circuitry 150 each coupleable to an output 132 of the DAC circuitry 130. In other words, the first analog mixer circuitry 140 and the second analog mixer circuitry 150 are not coupled to the output 132 of the DAC circuitry 130, but can be coupled to the output 132 of the DAC circuitry 130. For example, a respective electrically conductive trace (path) may be formed between the output 132 of the DAC circuitry 130 and the respective one of the first analog mixer circuitry 140 and the second analog mixer circuitry 150. Alternatively, the first analog mixer circuitry 140 and the second analog mixer circuitry 150 may be selectively coupled to the output 132 of the DAC circuitry 130 via optional switching circuitry of the transmit path 101 (not illustrated).

Additionally, the transmit path 101 comprises a first output node (terminal) 160, a second output node (terminal) 170 and optionally a third output node (terminal) 180. The first output node 160 is coupleable to the output of the first analog mixer circuitry 140. In other words, the first output node 160 is not coupled to the first analog mixer circuitry 140, but can be coupled to the first analog mixer circuitry 140. The second output node 170 is coupleable to an output of the second analog mixer circuitry 150. In other words, the second output node 170 is not coupled to the second analog mixer circuitry 170, but can be coupled to the second analog mixer circuitry 150. The third output node 180 is optional and coupleable to the output 132 of the DAC circuitry 130. In other words, the third output node 180 is not coupled to the output 132 of the DAC circuitry 130, but can be coupled to the output 132 of the DAC circuitry 130. For example, a respective electrically conductive trace (path) may be formed for coupling of a respective one of the output nodes 160, 170 and 180. Alternatively a respective one of the output nodes 160, 170 and 180 may be coupled via respective optional switching circuitry of the transmit path 101 (not illustrated).

The transmit path 101 offers a highly flexible transmit structure that enables improved usability compared to conventional structures. The transmit path 101 illustrated in FIG. 1 may be understood as a basis structure that allows adaption to various different use cases. For example, the transmit path 101 may be configured as ZIF transmit path, a direct conversion transmit path or a Real Intermediate Frequency (RIF, also known as High Intermediate Frequency, HIF or Complex Intermediate Frequency, CIF) transmit path. The adaptability of the transmit path 101 may allow usage of the semiconductor device for various different transmit concepts. For example, the semiconductor device 100 may be used for sub-6 GHz applications (traditional cellular applications), mmWave applications or other applications requiring ZIF or CIF IQ output signal pairs.

In the following, exemplary adaptations of the transmit path 101 for ZIF transmission, direct conversion transmission and RIF transmission will be described with reference to FIGS. 2 to 8. The semiconductor device 100 may be modified (complemented) to comprise one of the transmit paths described in the following.

Figure 2:
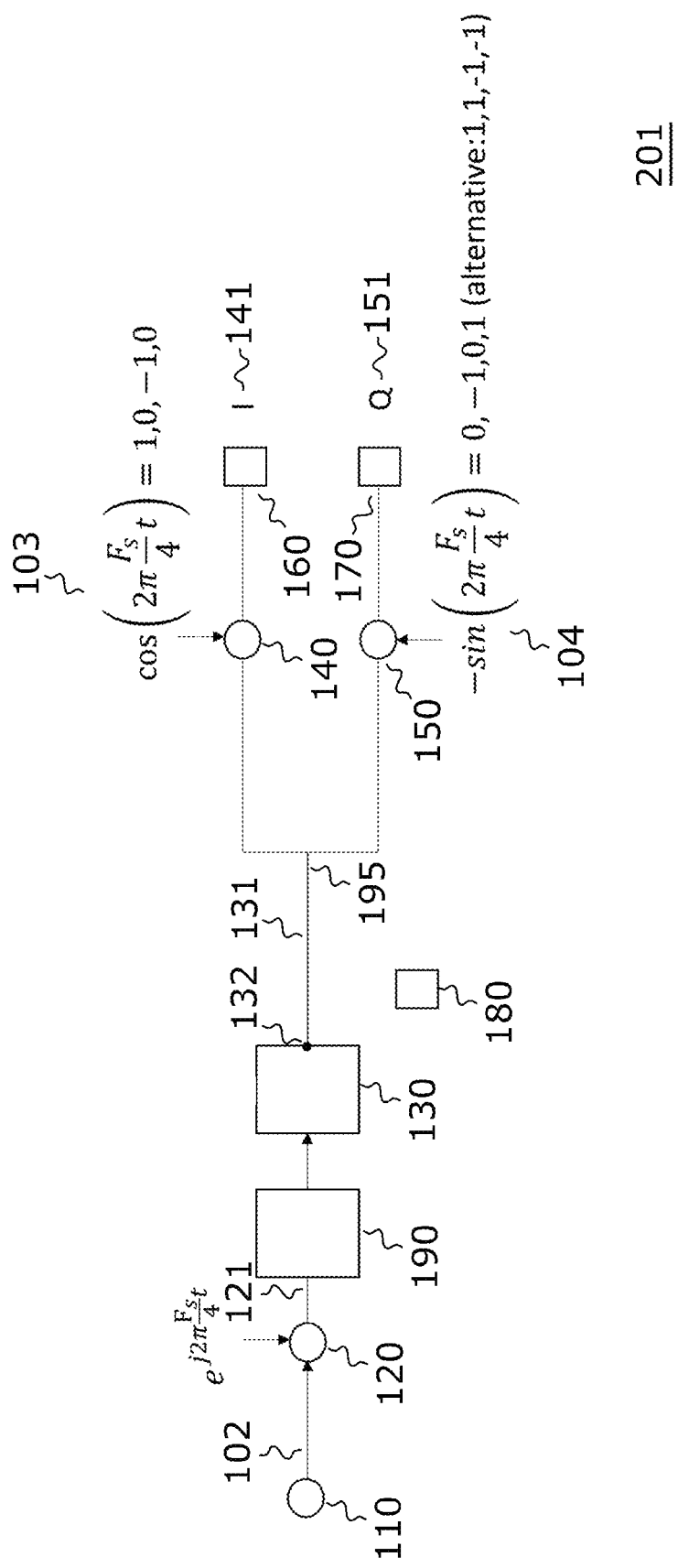
FIG. 2 illustrates a first example of a transmit path.

FIG. 2 illustrates a transmit path 201, which is based on the transmit path 101. In the following, only the differences between the transmit paths 101 and 201 will be highlighted.

In the example of FIG. 2, the first analog mixer circuitry 140 and the second analog mixer circuitry 150 are coupled to the output 132 of the DAC circuitry 130. Each of the first analog mixer circuitry 140 and the second analog mixer circuitry 150 is configured to receive the analog RF signal 131 output by the DAC circuitry 130. The first output node 160 is coupled to the output of the first analog mixer circuitry 140. Analogously, the second output node 170 is coupled to the output of the second analog mixer circuitry 150.

The first analog mixer circuitry 140 and the second analog mixer circuitry 150 are permanently coupled to the output 132 of the DAC circuitry 130 by permanent electrical connections 195 such as one or more conductive paths (traces) formed in the semiconductor device holding the transmit path 201. Analogously, the first output node 160 is permanently coupled to the output of the first analog mixer circuitry 140 via a permanent electrical connection such as one or more conductive paths (traces) formed in the semiconductor device holding the transmit path 201. Also the second output node 170 is permanently coupled to the output of the second analog mixer circuitry 150 via a permanent electrical connection such as one or more conductive paths (traces) formed in the semiconductor device holding the transmit path 201.

The third output node 180 (if present) remains (is) decoupled from the output 132 of the DAC circuitry 130 in the example of FIG. 2. In other words, no electrically conductive trace (path) is formed between the third output node 180 and the output 132 of the DAC circuitry 130.

The first analog mixer circuitry 140 is configured to generate an in-phase (I) output signal 141 by downconverting a frequency (center frequency) of the analog RF signal 131 to a (center) frequency of the digital baseband signal 102. Analogously, the second analog mixer circuitry 150 is configured to generate a quadrature (Q) output signal 151 by downconverting the frequency (center frequency) of the analog RF signal 131 to the (center) frequency of the baseband signal 102. The in-phase output signal 141 and the quadrature output signal 151 are phase-shifted by 90° with respect to each other. In other words, a (center) frequency of the in-phase output signal 141 and a (center) frequency of the quadrature output signal 151 are equal to the (center)

frequency of the digital baseband signal 102. For example, if the center frequency of the digital baseband signal is 0 Hz, the respective center frequency of each of the in-phase output signal 141 and the quadrature output signal 151 is 0 Hz.

The first analog mixer circuitry 140 is configured to downconvert the (center) frequency of the analog RF signal 131 using a first oscillation signal 103. The second analog mixer circuitry 150 is configured to downconvert the (center) frequency of the analog RF signal 131 using a second oscillation signal 104.

The signal shape of the first oscillation signal 103 may, e.g., be defined by:

$$\cos\left(2\pi\frac{F_s}{4}t\right) \quad (1)$$

The signal shape of the second oscillation signal 104 may, e.g., be defined by:

$$-\sin\left(2\pi\frac{F_s}{4}t\right) \quad (2)$$

As is evident from above mathematical expressions (1) and (2), the first oscillation signal 103 and the second oscillation signal 104 are phase-shifted by 90° with respect to each other. Further, it is to be noted that the signal shapes of the oscillation signals 103 and 104 are not limited to the above exemplary signal shapes. In general any oscillating signal shape may be used.

In the example of FIG. 2, the first and the second analog mixer circuitries 140 and 150 are both configured to downconvert the (center) frequency of the analog RF signal 131 by a frequency value equal to $F_s/4$, wherein $F_s$ denotes the value of DAC circuitry 130's sample rate.

The digital mixer circuitry 120 is configured to upconvert the (center) frequency of the digital baseband signal 102 by:

$$e^{j2\pi\frac{F_s}{4}t} \quad (3)$$

That is, the digital mixer circuitry 120 is configured to upconvert the (center) frequency of the digital baseband signal 102 by a frequency value equal to $F_s/4$.

In other words, the transmit path 201 generates an IQ output signal pair 141, 151 by combination of modulation (upconversion) in the digital domain by $F_s/4$ followed by demodulation (downconversion) in the analog domain by a frequency equal to $F_s/4$.

The transmit path 201 can be generated by simply coupling the analog mixer circuitries 140 and 150 and the output nodes 160 and 170 of the basic transmit path 101 illustrated in FIG. 1.

In the example of FIG. 2, the (center) frequencies of the various signals are shifted by $F_s/4$ Hz as this specific value enables a very efficient implementation. Shifting the various signals by $F_s/4$ Hz may, e.g., allow to use simple structures for the digital mixer circuitry 120 and the analog mixer circuitries 140 and 150. Further, shifting the various signals by $F_s/4$ Hz may allow to relax the requirements for filtering image components generated when up—and/or downconverting the respective signal in the transmit path 201. Accordingly, implementation/design of a respective filter circuitry for filtering image components (not illustrated in FIG. 2) may be facilitated (less complex).

For example, the transmit path 201 may optionally further comprise a respective low-pass filter (not illustrated in FIG. 2) between the DAC circuitry 130 and the respective one of the first and the second analog mixer circuitries 140 and 150. When shifting the various signals by $F_s/4$ Hz as described above, these low-pass filters may allow to attenuate the second Nyquist spectrum at $3 \cdot F_s/4$ Hz. Similarly, the transmit path 201 may optionally further comprise a respective low-pass filter (not illustrated in FIG. 2) between the respective one of the first and the second analog mixer circuitries 140 and 150 and the respective one of the first and the second output node 160 and 170. When shifting the various signals by $F_s/4$ Hz as described above, these low-pass filters may allow to suppress unwanted $F_s/4$ mixing products.

The requirements for the above described additional low-pass filters are relaxed compared to conventional approaches due to the shifting of the various signals by $F_s/4$ Hz. For example, the signals may according to the present disclosure exhibit a frequency of 4 GHz instead of 16 GHz as in conventional approaches, which would require extremely sharp filters around 2 GHz.

Figure 3:
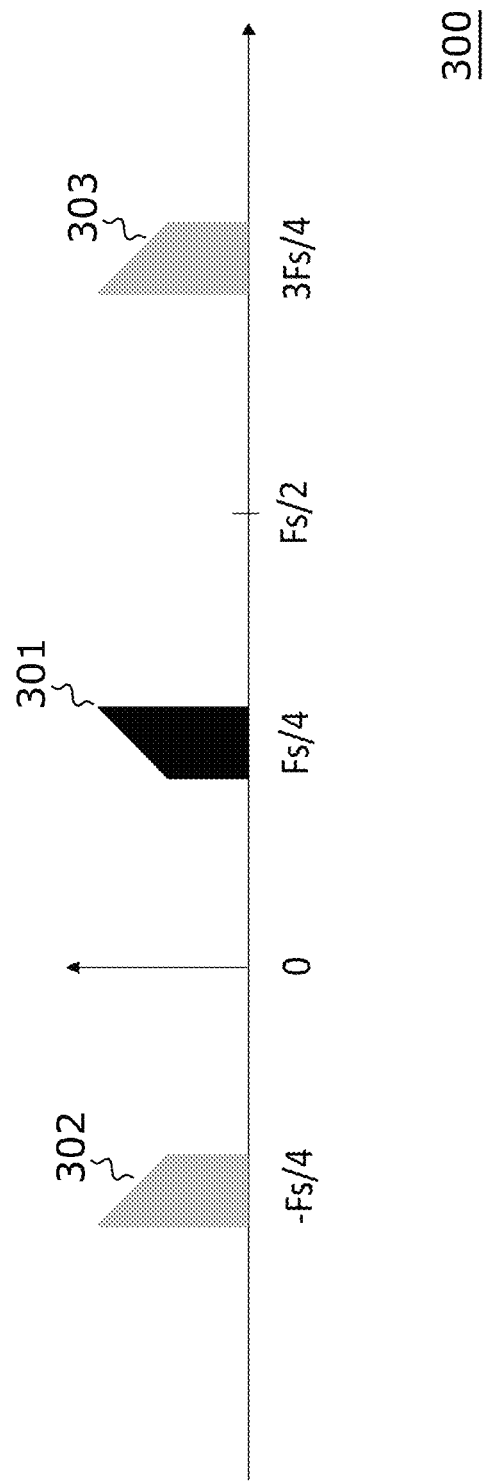
FIG. 3 illustrates an exemplary spectrum of an analog RF signal.

FIG. 3 illustrates an exemplary spectrum 300 of the analog RF signal 131. In the example of FIG. 3, the (center) frequency of the digital baseband signal 102 is upconverted from 0 to $F_s/4$ Hz. Accordingly, the analog RF signal 131 comprises a desired signal component 301 at $F_s/4$ Hz and two undesired image components 302 and 303 which are spaced $F_s/2$ Hz apart from the desired signal component 301 at $-F_s/4$ Hz and $3 \cdot F_s/4$ Hz.

As the various signals are shifted by $F_s/4$ Hz in the example of FIG. 3, the undesired image components 302 and 303 are spaced $F_s/2$ Hz apart from the desired signal component 301. Accordingly, they may be easily filtered out.

As indicated in FIG. 3, the undesired image components 302 and 303 are not mirror symmetric to each other unlike in conventional approaches using a respective separate DAC for each of the in-phase and the quadrature component.

Figure 4:
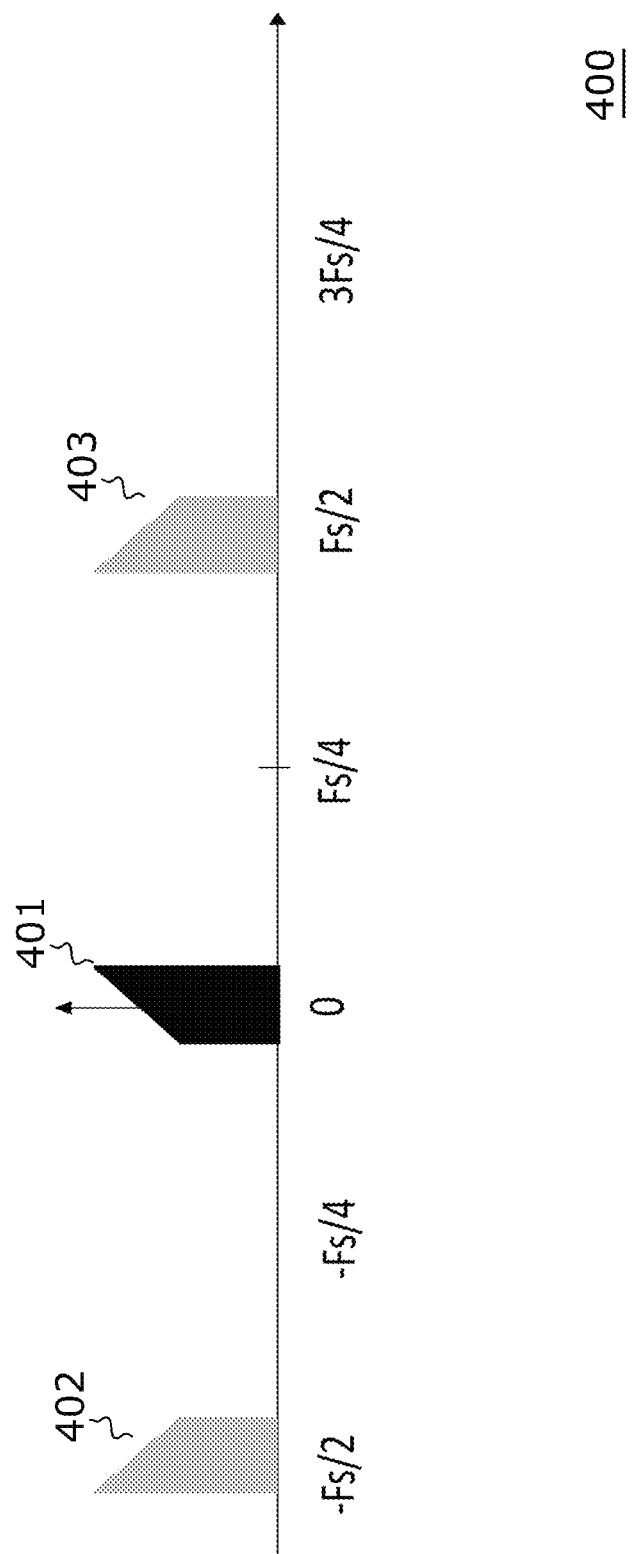
FIG. 4 illustrates an exemplary spectrum of an in-phase output signal or a quadrature output signal.

FIG. 4 further illustrates an exemplary spectrum 300 of each of the in-phase output signal 141 and the quadrature output signal 151. In the example of FIG. 4, the (center) frequency of the RF signal 131 is downconverted from $F_s/4$ to 0 Hz. Accordingly, each of the in-phase output signal 141 and the quadrature output signal 151 comprises a desired signal component 401 at 0 Hz and two undesired image components 402 and 403 which are spaced $F_s/2$ Hz apart from the desired signal component 401 at $-F_s/2$ Hz and $F_s/2$ Hz.

As the various signals are shifted by $F_s/4$ Hz in the example of FIG. 4, the undesired image components 402 and 403 are spaced $F_s/2$ Hz apart from the desired signal component 401. Accordingly, they may be easily filtered out.

As indicated in FIG. 4, the undesired image components 402 and 403 are not mirror symmetric to each other unlike in conventional approaches using a respective separate DAC for each of the in-phase and the quadrature component.

It is evident from FIG. 3 and FIG. 4 that the transmit path 201 generates the IQ output signal pair 141, 151 by modulation (upconversion) in the digital domain by $F_s/4$ Hz followed by demodulation (downconversion) in the analog domain by a frequency equal to $F_s/4$ Hz.

However, it is to be noted that the present disclosure is not limited to $F_s/4$. In general, any other suitable value may be used as well. For example, frequencies of the various signals may be shifted by $F_s/3$, $F_s/8$, $F_s/16$, . . . Hz.

The transmit path 201 may be used as a ZIF transmit path (i.e. the center frequency of the digital baseband signal 102 is 0 Hz) for generating the in-phase signal 141 and the quadrature signal 151. The example of FIG. 5 may be understood as a virtual ZIF RF-sampling data converter. For example, the transmit path 201 may be used for mmWave applications using further external mixer circuitry for further upconverting the in-phase signal 141 and the quadrature signal 151 prior to combining them.

Figure 5:
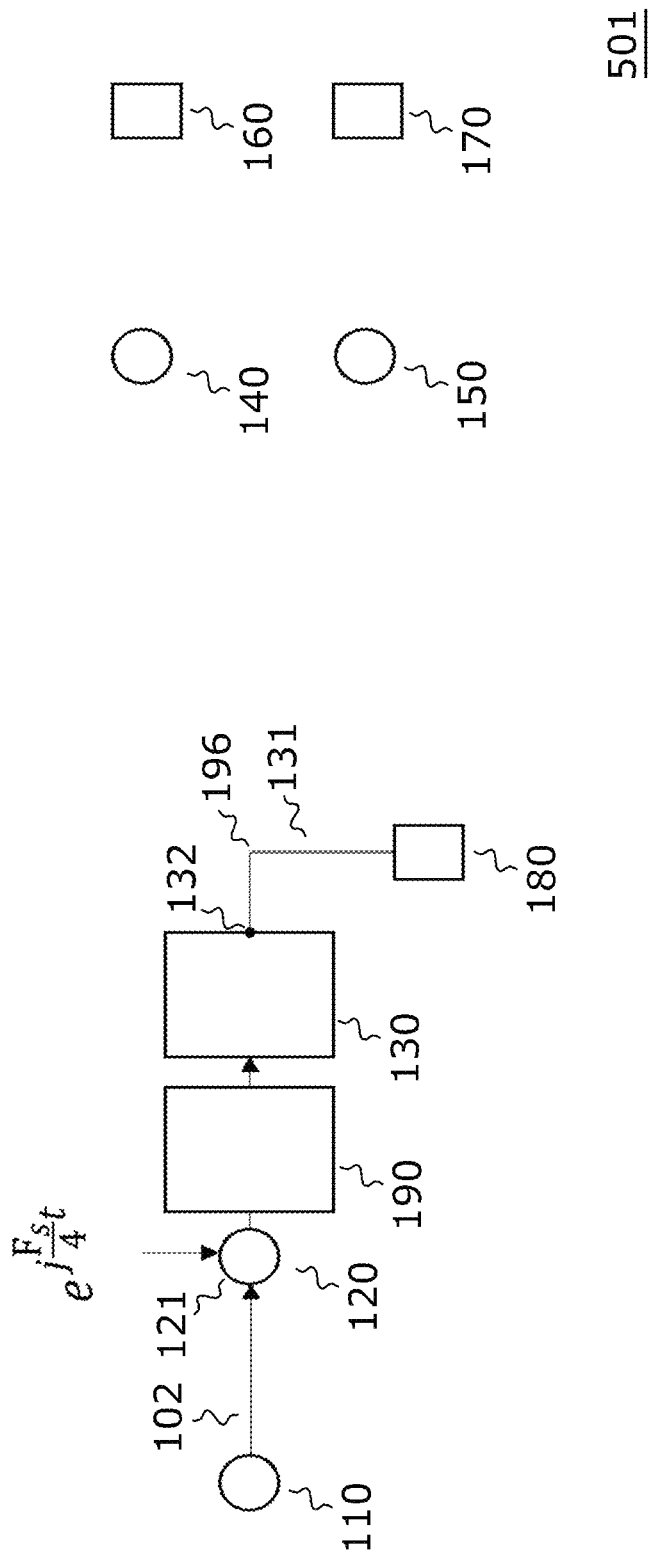
FIG. 5 illustrates a second example of a transmit path.

FIG. 5 illustrates another transmit path 501, which is based on the transmit path 101. In the following, only the differences between the transmit paths 101 and 501 will be highlighted.

In the example of FIG. 5, the third output node 180 is coupled to the output 132 of the DAC circuitry 130. The third output node 180 is permanently coupled to the output 132 of the DAC circuitry 130 by a permanent electrical connection 196 such as one or more conductive paths (traces) formed in the semiconductor device holding the transmit path 501. Accordingly, the third output node 180 is configured to output the analog RF signal 131 generated by the DAC circuitry 130.

The first output node 160 remains (is) decoupled from the output of the first analog mixer circuitry 140. Analogously, the second output node 170 remains (is) decoupled from the output of the second analog mixer circuitry 150. The first analog mixer circuitry 140 and the second analog mixer circuitry 150 remain (are) decoupled from the output 132 of the DAC circuitry 130. In other words, no electrically conductive trace (path) is formed between the output 132 of the DAC circuitry 130 and each of the first analog mixer circuitry 140 and the second analog mixer circuitry 150.

The digital mixer circuitry 120 is configured to upconvert the (center) frequency of the digital baseband signal 102 by:

$$e^{j\frac{F_S}{4}t} \qquad (4)$$

That is, the digital mixer circuitry 120 is configured to upconvert the (center) frequency of the digital baseband signal 102 by a frequency value equal to $F_S/4$. However, it is to be noted that the present disclosure is not limited to $F_S/4$. In general, any other suitable value may be used as well. For example, frequencies of the various signals may be shifted by $F_S/3$, $F_S/8$, $F_S/16$ . . . Hz.

The transmit path 501 may be used as a direction conversion transmit path for directly generating the analog RF signal 131 for transmission. For example, the transmit path 501 may be used for sub-6 GHz applications such as classical cellular applications.

Figure 6:
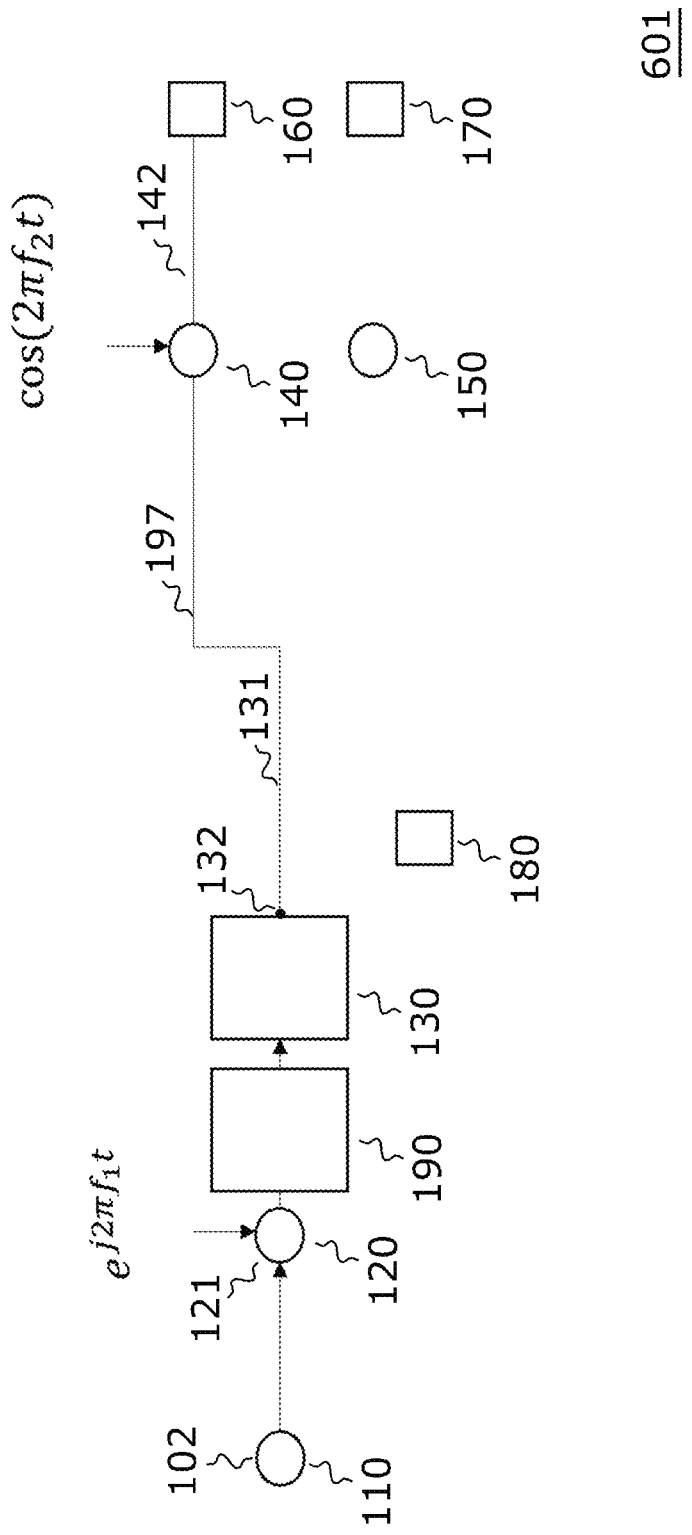
FIG. 6 illustrates a third example of a transmit path.

FIG. 6 illustrates another transmit path 601, which is based on the transmit path 101. In the following, only the differences between the transmit paths 101 and 601 will be highlighted.

In the example of FIG. 6, the first analog mixer circuitry 140 is coupled to the output 132 of the DAC circuitry 130. The first analog mixer circuitry 140 is permanently coupled to the output 132 of the DAC circuitry 130 via a permanent electrical connection 197 such as one or more conductive paths (traces) formed in the semiconductor device holding the transmit path 601. Further, the first output node 160 is coupled to the output of the first analog mixer circuitry 140. The first output node 160 is coupled to the output of the first analog mixer circuitry 140 via a permanent electrical connection such as one or more conductive paths (traces) formed in the semiconductor device holding the transmit path 601.

The second analog mixer circuitry 150 and the third output node 180 (if present) remain (are) decoupled from the output 132 of the DAC circuitry 130. In other words, no electrically conductive trace (path) is formed between the output 132 of the DAC circuitry 130 and each of the second analog mixer circuitry 150 and the third output node 180 (if present). Similarly, the second output node 170 remains (is) decoupled from the second analog mixer circuitry 150.

As illustrated in FIG. 6, the digital mixer circuitry 120 is configured to upconvert the (center) frequency of the digital baseband signal 102 by a frequency value $f_1$. The digital mixer circuitry 120 shifts the original (center) frequency of the digital baseband signal 102 by the non-zero frequency value $f_1$ for generating the upconverted digital baseband signal 121. The mixer circuitry 120 may, e.g., be configured to combine the digital baseband signal 102 with another signal exhibiting the non-zero frequency $f_1$ for upconverting the (center) frequency of the digital baseband signal 102. In other words, the digital mixer circuitry 120 is configured to upconvert the (center) frequency of the digital baseband signal 102 by:

$$e^{j2\pi f_1 t} \qquad (5)$$

The first analog mixer circuitry 140 is configured to receive the analog RF signal 131 from the DAC circuitry 130 and to upconvert the (center) frequency of the analog RF signal 131. The first analog mixer circuitry 140 is configured to upconvert the (center) frequency of the analog RF signal 131 using an oscillation signal 105.

The signal shape of the oscillation signal 105 may, e.g., be defined by:

$$\cos(2\pi f_2 t) \qquad (6)$$

It is to be noted that the signal shape of the oscillation signal 105 is not limited to the above exemplary signal shape. In general any oscillating signal shape may be used.

The first analog mixer circuitry 140 generates an analog RF output signal 142 by upconverting the (center) frequency of the analog RF signal 131.

In the example of FIG. 6, the signal frequency is upconverted twice such that the (center) frequency of the analog RF output signal 142 is $f_1+f_2$ Hz higher than the original (center) frequency of the digital baseband signal 102. The transmit path 601 may be used as a RIF (HIF, CIF) transmit path for generating the analog RF output signal 142 for transmission. For example, the transmit path 601 may be used for sub-6 GHz applications such as classical cellular applications.

Figure 7:
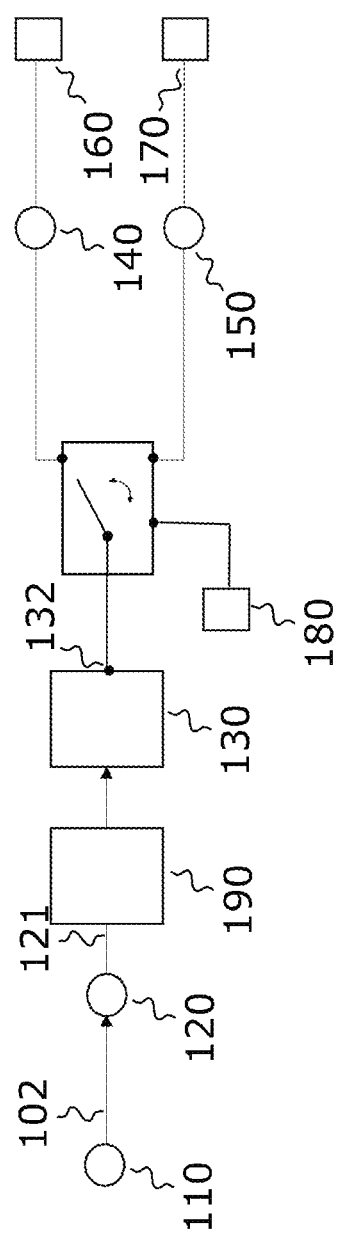
FIG. 7 illustrates a fourth example of a transmit path.

In the above examples, the first analog mixer circuitry 140, the second analog mixer circuitry 150 and the third output node 180 (if present) are coupled to the output 132 of the DAC circuitry 130 by means of a respective permanent electrical connection. However, the present disclosure is not limited thereto. FIG. 7 illustrates an alternative transmit path 701 comprising switching circuitry 199 for selectively coupling one or more of the first analog mixer circuitry 140, the second analog mixer circuitry 150 and the third output node 180 (if present) to the output 132 of the DAC circuitry 130. For example, the switching circuitry 199 may comprise one or more semiconductor switch such as one or more transistor or one or more transistor network for the selective coupling of the individual elements to the output 132 of the DAC circuitry 130.

The switching circuitry 199 is coupled to each of the first analog mixer circuitry 140, the second analog mixer circuitry 150 and the third output node 180 (if present) via a respective node, and is configured to selectively couple one or more of the first analog mixer circuitry 140, the second analog mixer circuitry 150 and the third output node 180 (if present) to the output 132 of the DAC circuitry 130. The switching circuitry 199 may allow to operate the transmit path 701 in different operation modes.

For example, in a first operation mode of the transmit path 701, the switching circuitry 199 may be configured to couple both the first analog mixer circuitry 140 and the second analog mixer circuitry 150 to the output 132 of the DAC circuitry 130, whereas the third output node 180 (if present) is decoupled from the output 132 of the DAC circuitry 130 by the switching circuitry 199. Accordingly, the transmit path 701 may be operated as a ZIF transmit path similar to what is described above for the transmit path 201.

In a second operation mode of the transmit path 701, the switching circuitry 199 may be configured to couple the third output node 180 to the output 132 of the DAC circuitry 130, whereas both the first analog mixer circuitry 140 and the second analog mixer circuitry 150 are decoupled from the output 132 of the DAC circuitry 130 by the switching circuitry 199. Accordingly, the transmit path 701 may be operated as a direct conversion transmit path similar to what is described above for the transmit path 501.

In a third operation mode of the transmit path 701, the switching circuitry 199 may be configured to couple the first analog mixer circuitry 140 to the output 132 of the DAC circuitry 130, whereas both the second analog mixer circuitry 150 and the third output node 180 (if present) are decoupled from the output 132 of the DAC circuitry 130 by the switching circuitry 199. Accordingly, the transmit path 701 may be operated as a RIF (HIF, CIF) transmit path similar to what is described above for the transmit path 601.

The transmit path 701 may exhibit an increased flexibility and/or usability compared to the previously described transmit paths.

Analogously to what is described above for the switching circuitry 199, one of the above described transmit paths may comprise one or more of switching circuitry for selectively coupling the first output node 160 to the output of the first analog mixer circuitry 140 and switching circuitry for selectively coupling the second output node 170 to the output of the second analog mixer circuitry 150. The respective switching circuitry may comprise one or more semiconductor switch such as one or more transistor or one or more transistor network for coupling the respective output node 160 or 170 to the respective analog mixer circuitry 140 or 150.

Figure 8:
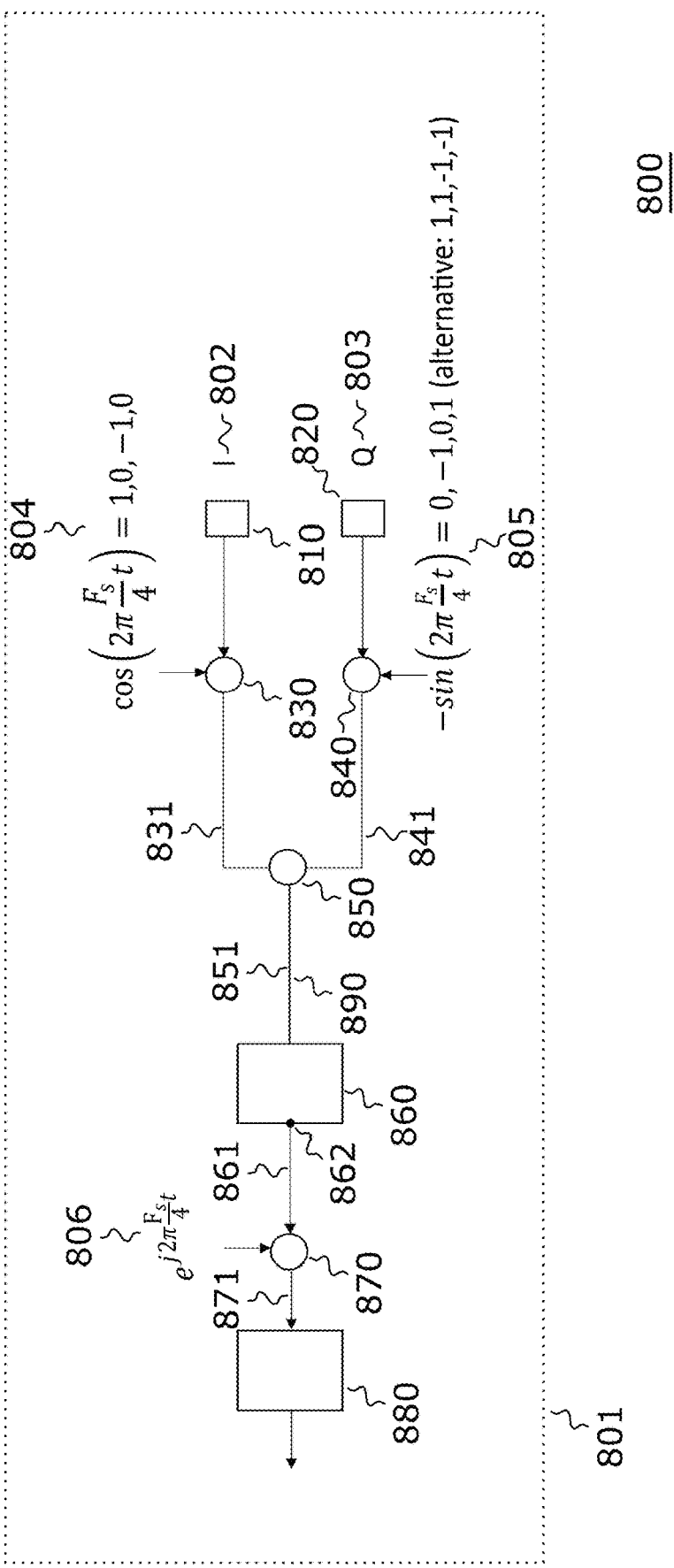
FIG. 8 illustrates a first example of a semiconductor device comprising at least one receive path.

While the above description focused on the transmit side, the following description will focus on the receive side. FIG. 8 illustrates an example of a semiconductor device 800. The semiconductor device 800 comprises at least one receive path 801 (i.e. one or more receive path 801) as illustrated in FIG. 8. In some examples, the semiconductor device 800 may comprise exactly one receive path 801 as illustrated in FIG. 8. In other example, the semiconductor device 800 may comprise a plurality of receive paths 801. The semiconductor device 800 may, e.g., be a semiconductor die, a semiconductor chip or a semiconductor package.

The receive path 801 comprises a first input node (terminal) 810 for receiving an analog in-phase (I) input signal 802. Further, the receive path 801 comprises a second input node (terminal) 820 for receiving an analog quadrature (Q) input signal 803. The analog in-phase input signal 802 and the analog quadrature input signal 803 are phase-shifted by 90° with respect to each other. A respective center frequency of each of the analog in-phase input signal 802 and the analog quadrature input signal 803 may, e.g., be 0 Hz. However, it is to be noted that the present disclosure is not limited thereto. In other examples, the respective center frequency of the analog in-phase input signal 802 and the analog quadrature input signal 803 may be non-zero. For example, the respective center frequency of the analog in-phase input signal 802 and the analog quadrature input signal 803 may be less than 5 Hz, 10 Hz or 20 Hz.

The receive path 801 further comprises first analog mixer circuitry 830 coupled to the first input node 810. The first analog mixer circuitry 830 is configured to generate an upconverted analog in-phase input signal 831 by upconverting the (center) frequency of the analog in-phase input signal 802. In other words, the first analog mixer circuitry 830 shifts the original (center) frequency of the analog in-phase input signal 802 to a higher (center) frequency for generating the upconverted analog in-phase input signal 831. The first analog mixer circuitry 830 is configured to upconvert the (center) frequency of the analog in-phase input signal 802 using a first oscillation signal 804.

Analogously, the receive path 801 comprises second analog mixer circuitry 840 coupled to the second input node 820. The second analog mixer circuitry 840 is configured to generate an upconverted analog quadrature input signal 841 by upconverting the (center) frequency of the analog quadrature input signal 803. In other words, the second analog mixer circuitry 840 shifts the original (center) frequency of the analog quadrature input signal 803 to a higher (center) frequency for generating the upconverted analog quadrature input signal 841. The second analog mixer circuitry 840 is configured to upconvert the (center) frequency of the analog quadrature input signal 803 using a second oscillation signal 805.

The signal shape of the first oscillation signal 804 may, e.g., be defined by:

$$\cos\left(2\pi \frac{F_s}{4} t\right) \quad (7)$$

The signal shape of the second oscillation signal 805 may, e.g., be defined by:

$$-\sin\left(2\pi \frac{F_s}{4} t\right) \quad (8)$$

As is evident from above mathematical expressions (7) and (8), the first oscillation signal 804 and the second oscillation signal 805 are phase-shifted by 90° with respect to each other. Further, it is to be noted that the signal shapes of the oscillation signals 804 and 805 are not limited to the above exemplary signal shapes. In general any oscillating signal shape may be used.

The receive path 801 further comprises combiner circuitry 850 configured to combine the upconverted analog in-phase input signal 841 and the upconverted analog quadrature input signal 851 to an analog input signal 850. For example, the combiner circuitry 850 may be an adder or any other suitable circuitry for combining the upconverted analog in-phase input signal 841 and the upconverted analog quadrature input signal 851.

Additionally, the receive path 801 comprises Analog-to-Digital Converter (ADC) circuitry 860 coupled to the combiner circuitry 850. The ADC circuitry is configured to generate a digital input signal 861 based on the analog input signal 851. The ADC circuitry 860 may be a high-speed data converter. Hence, the ADC circuitry 860's sample rate may be at least 1 GSPS. For example, the ADC circuitry 860's sample rate may be 4 GSPS, 8 GSPS, 12 GSPS, 16 GSPS or more. However, it is to be noted that the present disclosure is not limited thereto. In other examples, ADC circuitry 860's sample rate may take other values. For example, the ADC circuitry 860's sample rate may be less than 1 GSPS. The (center) frequency of the analog input signal 851 may be in the first Nyquist zone, i.e., a value of the analog input signal 851's (center) frequency may be half of a value of the sample rate of the ADC circuitry 860 or smaller. For example, the value of the analog input signal 851's (center) frequency may be quarter of the value of the ADC circuitry 860's sample rate. However, it is to be noted that the present disclosure is not limited thereto. In other examples, the value of the analog input signal 851's (center) frequency may take other values.

The receive path 801 further comprise digital mixer circuitry 870 coupled to an output 862 of the ADC circuitry 860. The digital mixer circuitry 870 is configured to generate a digital baseband signal 871 by downconverting a (center) frequency of the digital input signal 861. In other words, the digital mixer circuitry 870 shifts the original (center) frequency of the digital input signal 861 to a lower (center) frequency for generating the digital baseband signal 871. The digital mixer circuitry 870 may, e.g., be configured to generate the digital baseband signal 871 by downconverting the (center) frequency of the digital input signal 861 to the (center) frequency of the analog in-phase input signal 802 and the analog quadrature input signal 803. For example, if the respective center frequency of the analog in-phase input signal 802 and the analog quadrature input signal 803 is 0 Hz, the center frequency of the digital baseband signal 871 may be 0 Hz.

The digital mixer circuitry 870 may, e.g., be configured to combine the digital input signal 861 with another signal 806 exhibiting a non-zero (center) frequency for downconverting the (center) frequency of the digital input signal 861. For example, the digital mixer circuitry 870 may be configured to downconvert the (center) frequency of the digital input signal 861 by:

$$e^{j 2\pi \frac{F_S}{4} t} \quad (9)$$

As described above, in the example of FIG. 8, the first and the second analog mixer circuitries 830 and 840 are both configured to upconvert the (center) frequency of the respective one of the analog in-phase input signal 802 and the analog quadrature input signal 803 by a frequency value equal to $F_S/4$, wherein $F_S$ denotes the value of ADC circuitry 860's sample rate. Analogously, the digital mixer circuitry 120 is configured to downconvert the (center) frequency of the digital input signal 861 by a frequency value equal to $F_S/4$.

In other words, the receive path 801 generates the digital baseband signal 871 by combination of modulation (upconversion) in the analog domain by $F_S/4$ Hz followed by demodulation (downconversion) in the digital domain by a frequency equal to $F_S/4$ Hz.

In the example of FIG. 8, the (center) frequencies of the various signals are shifted by $F_S/4$ Hz as this specific value enables a very efficient implementation. Shifting the various signals by $F_S/4$ Hz may, e.g., allow to use simple structures for the digital mixer circuitry 870 and the analog mixer circuitries 830 and 840. Further, shifting the various signals by $F_S/4$ Hz may allow to relax the requirements for filtering image components generated when up—and/or downconverting the respective signal in the receive path 801. Accordingly, implementation/design of a respective filter circuitry for filtering image components (not illustrated in FIG. 2) may be facilitated (less complex).

Figure 9:
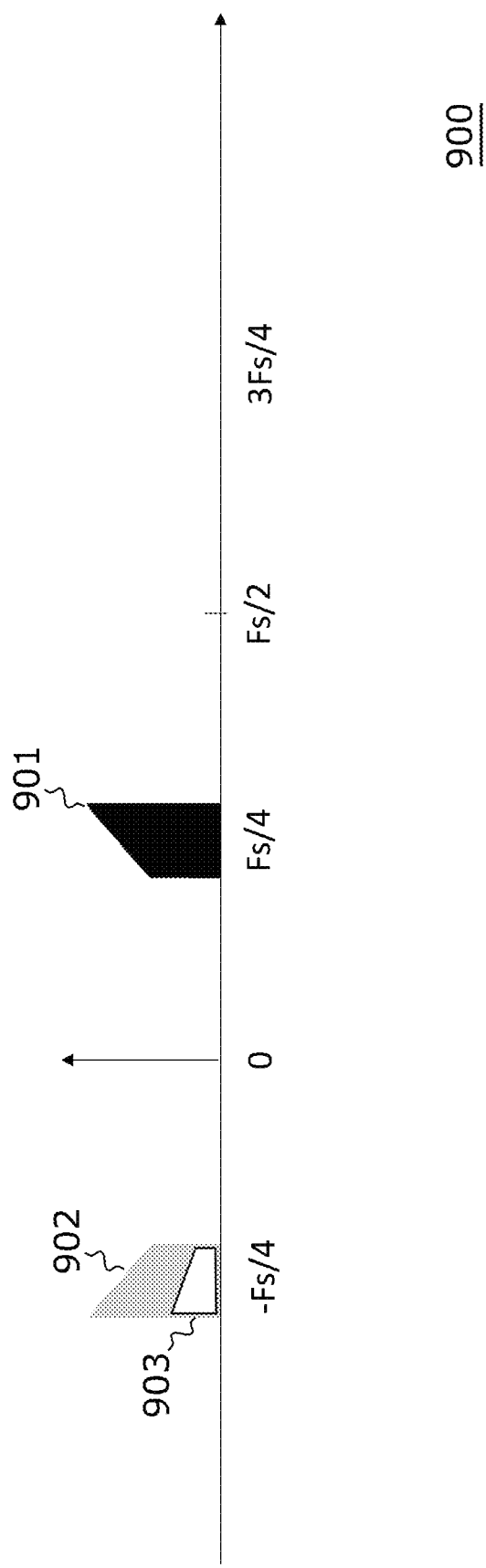
FIG. 9 illustrates an exemplary spectrum of an analog input signal.

FIG. 9 illustrates an exemplary spectrum 900 of the analog input signal 851. In the example of FIG. 9, the respective (center) frequency of the analog in-phase input signal 802 and the analog quadrature input signal 803 is upconverted from 0 to $F_S/4$ Hz. Accordingly, the analog input signal 851 comprises a desired signal component 901 at $F_S/4$ Hz and an undesired image component 902 which is spaced $F_S/2$ Hz apart from the desired signal component 401 at $-F_S/4$ Hz.

As the various signals are shifted by $F_S/4$ Hz in the example of FIG. 9, the undesired image components 902 is spaced $F_S/2$ Hz apart from the desired signal component 901. Accordingly, it may be easily filtered out.

Further illustrated is a signal component 903 at $-F_S/4$ Hz caused by IQ imbalance of the receive path 801.

Figure 10:
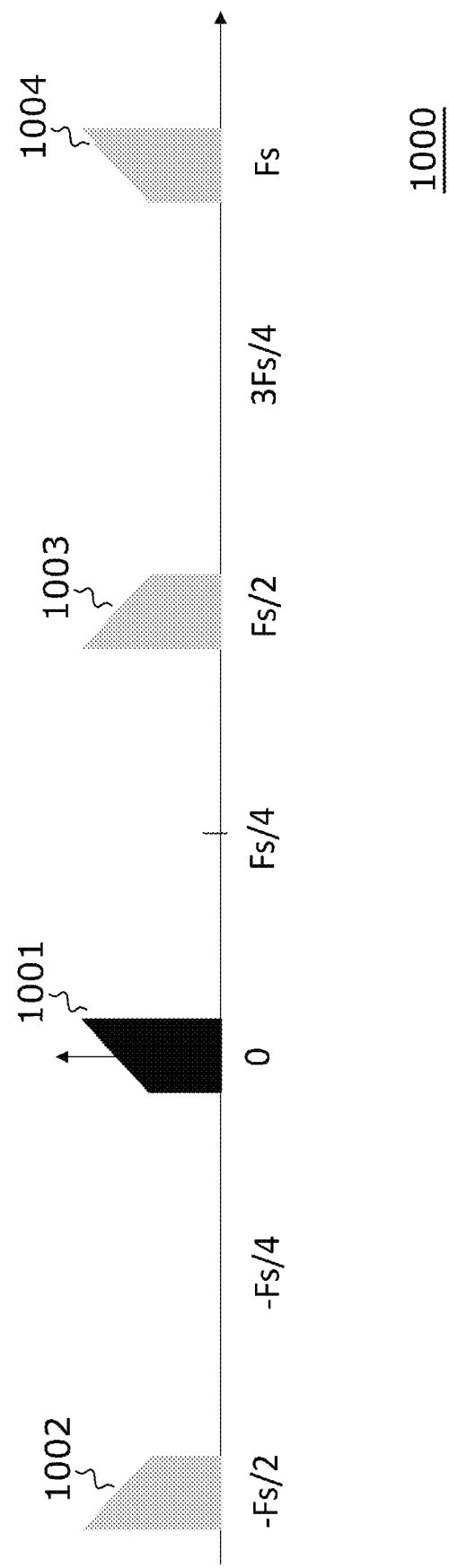
FIG. 10 illustrates an exemplary spectrum of a digital baseband signal.

FIG. 10 further illustrates an exemplary spectrum 1000 of the digital baseband signal 871. In the example of FIG. 10, the (center) frequency of the digital input signal 861 is downconverted from $F_S/4$ to 0 Hz. Accordingly, the digital baseband signal 871 comprises a desired signal component 1001 at 0 Hz, an undesired image component, which is spaced $F_S/2$ Hz apart from the desired signal component 1001 at $-F_S/2$ Hz, and two replica components 1003 and 1004 at $F_S/2$ Hz and $F_S$ Hz from the mixing process at the digital mixer circuitry 870.

As the digital input signal 861 is shifted by $F_S/4$ Hz in the example of FIG. 10, the undesired components 1002, 1003 and 1004 are spaced $F_S/2$ Hz apart from the desired signal component 1001. Accordingly, the undesired components 1002 and 1003 may be easily filtered out.

As indicated in FIG. 10, the undesired replica components 1003 and 1004 are not mirror symmetric to each other unlike in conventional approaches using a respective separate ADC for each of the in-phase and the quadrature component.

It is evident from FIG. 9 and FIG. 10 that the receive path 801 generates the digital baseband signal 871 by combination of modulation (upconversion) in the analog domain by $F_S/4$ Hz followed by demodulation (downconversion) in the digital domain by a frequency equal to $F_S/4$ Hz.

However, it is to be noted that the present disclosure is not limited to $F_S/4$. In general, any other suitable value may be used as well. For example, frequencies of the various signals may be shifted by $F_S/3$, $F_S/8$, $F_S/16$, . . . Hz.

For filtering undesired signal components such as the undesired components 1002, 1003 and 1004 illustrated in FIG. 10, the receive path 801 may optionally further comprise low-pass filter circuitry 880 coupled to the digital mixer circuitry 870 and configured to low-pass filter the digital baseband signal 871.

The receive path 801 may be used as a ZIF receive path (i.e. the respective center frequency of the analog in-phase input signal 802 and the analog quadrature input signal 803 is 0 Hz) for generating the digital baseband signal 871. For example, the receive path 801 may be used for mm Wave applications using further external mixer circuitry for downconverting a RF receive signal to the analog in-phase input signal 802 and the analog quadrature input signal 803.

In the example of FIG. 8, the ADC circuitry 860 and the combiner circuitry 850 are coupled to each other by means of a permanent electrical connection 890 such as one or more conductive paths (traces) formed in the semiconductor device 800 holding the receive path 801. However, the present disclosure is not limited thereto.

Figure 11:
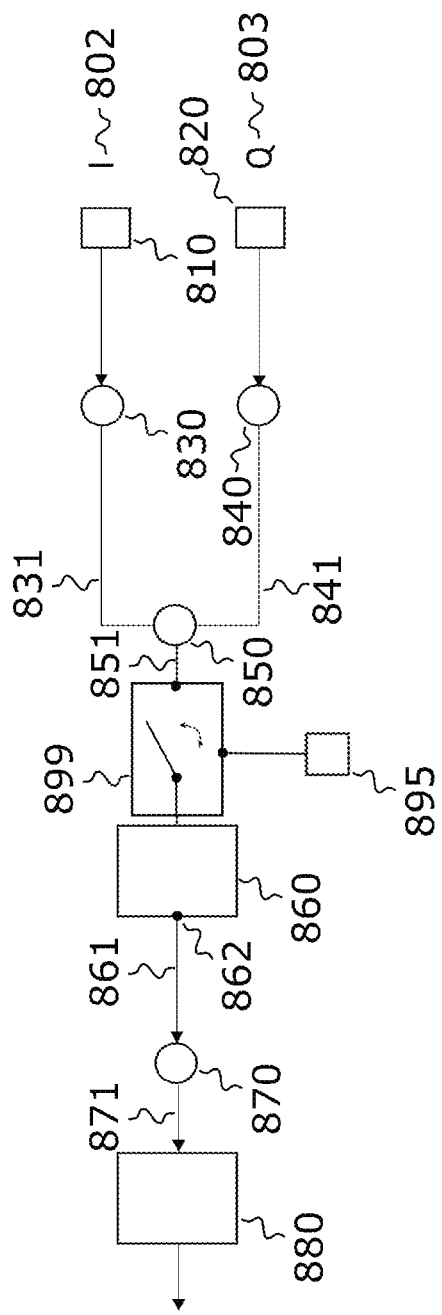
FIG. 11 illustrates another example of a receive path.

FIG. 11 illustrates an alternative receive path 1101 additionally comprising a third input node (terminal) 895 for receiving a RF input signal 807, and switching circuitry 899 for selectively coupling the combiner circuitry 850 or the third input node 895 to the ADC circuitry 860. For example, the switching circuitry 899 may comprise one or more semiconductor switch such as one or more transistor or one or more transistor network for the selective coupling of the individual elements to the ADC circuitry 860.

The switching circuitry 899 is coupled to each of the combiner circuitry 850 and the third input node 895 via a respective node and is configured to selectively couple either the combiner circuitry 850 or the third input node 895 to the ADC circuitry 860. The switching circuitry 899 may allow to operate the receive path 1101 in different operation modes.

For example, in a first operation mode of the receive path 1101, the switching circuitry 899 may be configured to couple the combiner circuitry 850 to the ADC circuitry 860, whereas the third input node 895 is decoupled from the ADC circuitry 860 by the switching circuitry 899. Accordingly, the receive path 1101 may be operated as a ZIF receive path similar to what is described above for the receive path 801.

In a second operation mode of the receive path 1101, the switching circuitry 899 may be configured to couple the third input node 895 to the ADC circuitry 860, whereas the combiner circuitry 850 is decoupled from the ADC circuitry 860 by the switching circuitry 899. In the second operation mode, i.e., in case the third input node 895 is coupled to the DAC circuitry 860, the DAC circuitry 860 is configured to generate the digital input signal 861 based on the RF input signal 807 instead of the analog input signal 851. Accordingly, the receive path 1101 may be operated as a direct conversion receive path for directly generating the digital baseband signal 871. For example, the second operation mode may be used for sub-6 GHz applications such as classical cellular applications.

The receive path 1101 may exhibit an increased flexibility and/or usability compared to the previously described receive path 801.

Figure 12:
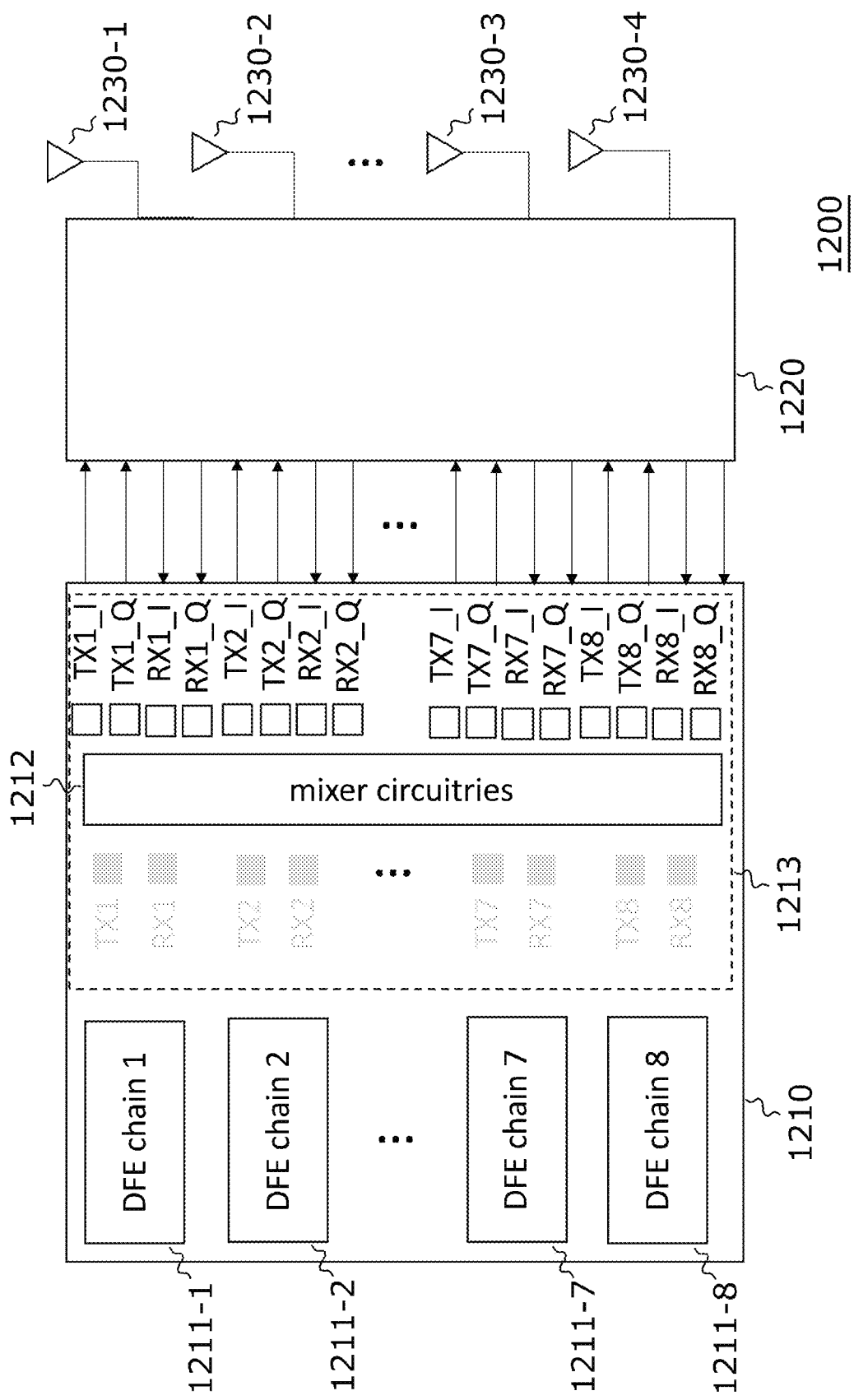
FIG. 12 illustrates an example of wireless communication circuitry.

FIG. 12 illustrates an exemplary wireless communication circuitry 1200 comprising transmit and receive paths according to the architecture described above.

In particular, the wireless communication circuitry 1200 comprises a transceiver 1210 which is coupled to eight antennas 1230-1, . . . , 1230-4 via an RF front-end 1220. For example, the wireless communication circuitry 1200 may be used for mmWave applications.

The transceiver 1210 combines eight transmit paths and eight receive paths as described above to form eight transmit and receive channels for the eight antennas 1230-1, . . . , 1230-4. For example, the transmit paths may be configured as described above with respect to FIG. 2, whereas the receive paths are configured as described above with respect to FIG. 8.

The digital circuitry of the respective transmit and receive channel (e.g. the digital mixer circuitries, the ADC circuitries, the DAC circuitries, or the filter circuitries) is grouped in a respective digital front-end 1211-1, . . . , 1211-8 of the respective transmit and receive channel.

The analog circuitry of the eight transmit and receive channels is highlighted in the box 1213 schematically illustrating the respective analog mixer circuitries of the eight transmit and receive channels as well as the respective output nodes TX1_I, TX1_Q, . . . , TX8_I, TX8_Q for the in-phase and quadrature signals generated by the transmit paths and the respective input nodes RX1_I, RX1_Q, . . . , RX8_I, RX8_Q for the in-phase and quadrature signals to be processed by the receive paths. Further indicated in box 1213 are the third input nodes TX1, RX1, . . . , TX8, RX8 which are not coupled to the respective ADC or DAC circuitry.

It is to be noted that the present disclosure is not limited to eight transmit and receive channels (paths). In general, any number of transmit and receive channels may be used (e.g., 4, 12, 16, etc.).

Figure 13:
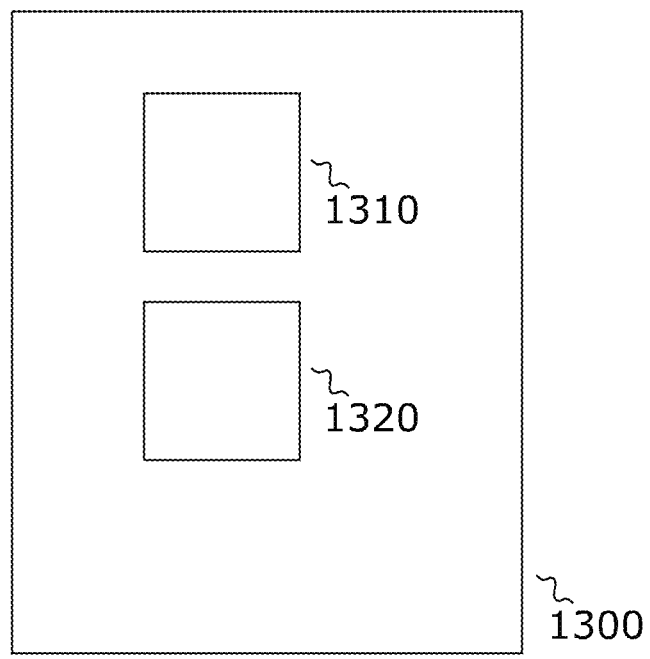
FIG. 13 illustrates an example of a transceiver.

FIG. 13 illustrates another transceiver 1300 according to the present disclosure. The transceiver 1300 comprises a first semiconductor device 1310 comprising at least one transmit path as described above. Further, the transceiver 1300 comprises a second semiconductor device 1320 comprising at least one receive path as described above. In other words, the transceiver comprises at least one transmit path as described above and at least one receive path as described above.

Although the first semiconductor device 1310 and the second semiconductor device 1320 are illustrated as separate elements in FIG. 13, it is to be noted that first semiconductor device 1310 and the second semiconductor device 1320 may be implemented integrally in other examples. In other words, a single semiconductor device may comprise at least one transmit path as described above and at least one receive path as described above.

The transceiver 1300 may provide improved transmission and/or reception capabilities compared to conventional transceiver structures.

Figure 14:
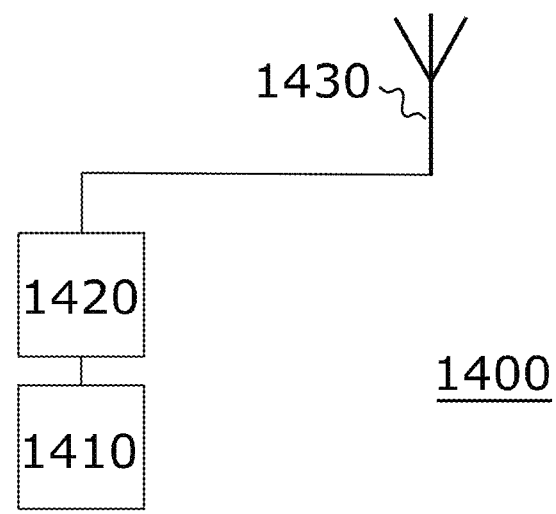
FIG. 14 illustrates an example of a base station.

An example of an implementation using transmit and receive paths according to one or more aspects of the architecture described above in connection with FIGS. 1 to 13 or one or more examples described above in connection with FIGS. 1 to 13 is illustrated in FIG. 14. FIG. 14 schematically illustrates an example of a radio base station 1400 (e.g. for a femtocell, a picocell, a microcell or a macrocell) comprising a transceiver 1410 as proposed.

The transceiver 1410 comprises at least one transmit path and/or at least one receive path as described above. Further, the base station 1400 comprises at least one antenna 1430 coupled to the transceiver 1410. One or more signal output by the transmit path of the transceiver 1410 according to the above described principles may be radiated to the environment via the at least one antenna 1430. Analogously, one or more signal received from the environment by the at least one antenna 1430 may be provided to the receive path of the transceiver 1410 for further processing according to the above described principles.

Analog front-end circuitry 1420 may be coupled between the transceiver 1410 and the at least one antenna 1430. For example, the analog front-end circuitry 1420 may comprise one or more of a filter, additional mixer circuitry for up— and/or downconversion, a Power Amplifier (PA), a Low Noise Amplifier (LNA), ElectroStatic Discharge (ESD) protection circuitry, etc.

To this end, a base station with improved transmission and/or reception capabilities may be provided.

The base station 1400 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 15:
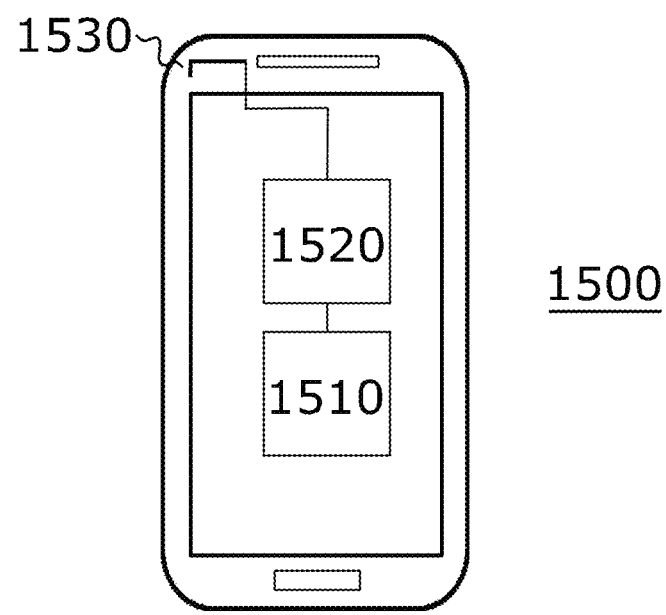
FIG. 15 illustrates an example of a mobile device.

Another example of an implementation using transmit and receive paths according to one or more aspects of the architecture described above in connection with FIGS. 1 to 13 or one or more examples described above in connection with FIGS. 1 to 13 is illustrated in FIG. 15. FIG. 15 schematically illustrates an example of a mobile device 1500 (e.g. mobile phone, smartphone, tablet-computer, or laptop) comprising a transceiver 1510 as proposed.

The transceiver 1510 comprises at least one transmit path and/or at least one receive path as described above. Further, the mobile device 1500 comprises at least one antenna 1530 coupled to the transceiver 1510. One or more signal output by the transmit path of the transceiver 1510 according to the above described principles may be radiated to the environment via the at least one antenna 1530. Analogously, one or more signal received from the environment by the at least one antenna 1530 may be provided to the receive path of the transceiver 1510 for further processing according to the above described principles.

Analog front-end circuitry 1520 may be coupled between the transceiver 1510 and the at least one antenna 1530. For example, the analog front-end circuitry 1520 may comprise one or more of a filter, additional mixer circuitry for up— and/or downconversion, a PA, an LNA, ESD protection circuitry, etc.

To this end, a mobile device with improved transmission and/or reception capabilities may be provided.

The mobile device 1500 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using transmit and/ or receive paths according to the proposed architecture or one or more of the examples described above may be configured to operate according to one of the $3^{rd}$ Generation Partnership Project (3GPP)-standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/ EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

An example (e.g. example 1) relates to a semiconductor device comprising at least one transmit path. The transmit path comprises an input node for receiving a digital baseband signal; digital mixer circuitry coupled to the input node and configured to generate an upconverted digital baseband signal by upconverting a frequency of the digital baseband signal; DAC circuitry coupled to the digital mixer circuitry and configured to generate an analog RF signal based on the upconverted digital baseband signal; first analog mixer circuitry coupleable to an output of the DAC circuitry; second analog mixer circuitry coupleable to the output of the DAC circuitry; a first output node coupleable to an output of the first analog mixer circuitry; and a second output node coupleable to an output of the second analog mixer circuitry.

Another example (e.g. example 2) relates to a previously described example (e.g. example 1), wherein: the first analog mixer circuitry and the second analog mixer circuitry are coupled to the output of the DAC circuitry and each configured to receive the analog RF signal, the first output node is coupled to the output of the first analog mixer circuitry, the second output node is coupled to the output of the second analog mixer circuitry, the first analog mixer circuitry is configured to generate an in-phase output signal by downconverting a frequency of the analog RF signal to a frequency of the digital baseband signal, and the second analog mixer circuitry is configured to generate a quadrature output signal by downconverting the frequency of the analog RF signal to the frequency of the digital baseband signal, the in-phase output signal and the quadrature output signal being phase-shifted by 90° with respect to each other.

Another example (e.g. example 3) relates to a previously described example (e.g. example 2), further comprising a third output node coupleable to the output of the DAC circuitry, wherein the third output node is decoupled from the output of the DAC circuitry.

Another example (e.g. example 4) relates to a previously described example (e.g. example 3), wherein the first analog mixer circuitry is configured to downconvert the frequency of the analog RF signal using a first oscillation signal, and wherein the second analog mixer circuitry is configured to downconvert the frequency of the analog RF signal using a second oscillation signal, the first oscillation signal and the second oscillation signal being phase-shifted by 90° with respect to each other.

Another example (e.g. example 5) relates to a previously described example (e.g. any one of examples 2 to 4), wherein a frequency of the in-phase output signal and a frequency of the quadrature output signal are equal to a frequency of the digital baseband signal, or wherein the digital mixer circuitry is configured to upconvert the frequency of the digital baseband signal by a first frequency value and the first and the second analog mixer circuitries are both configured to downconvert the frequency of the analog RF signal by a second frequency value, the first frequency value being equal to the second frequency value.

Another example (e.g. example 6) relates to a previously described example (e.g. example 1), further comprising a third output node coupled to the output of the DAC circuitry, wherein: the third output node is configured to output the analog RF signal, and the first analog mixer circuitry and the second analog mixer circuitry are decoupled from the output of the DAC circuitry.

Another example (e.g. example 7) relates to a previously described example (e.g. example 6), wherein the first output node is decoupled from the output of the first analog mixer circuitry, and wherein the second output node is decoupled from the output of the second analog mixer circuitry.

Another example (e.g. example 8) relates to a previously described example (e.g. example 1), wherein the first analog mixer circuitry is coupled to the output of the DAC circuitry, wherein the first output node is coupled to the output of the first analog mixer circuitry, and wherein the first analog mixer circuitry is configured to: receive the analog RF signal; and generate an analog RF output signal by upconverting a frequency of the analog RF signal.

Another example (e.g. example 9) relates to a previously described example (e.g. example 8), wherein the second analog mixer circuitry is decoupled from the output of the DAC circuitry.

Another example (e.g. example 10) relates to a previously described example (e.g. example 8 or example 9), further comprising a third output node coupleable to the output of the DAC circuitry, wherein the third output node is decoupled from the output of the DAC circuitry.

Another example (e.g. example 11) relates to a previously described example (e.g. any one of examples 1 to 10), further comprising switching circuitry configured to selectively couple, based on an operation mode of the transmit path, one or more of the first analog mixer circuitry and the second analog mixer circuitry to the output of the DAC circuitry.

Another example (e.g. example 12) relates to a previously described example (e.g. example 11), further comprising a third output node coupleable to the output of the DAC circuitry, wherein the switching circuitry is configured to selectively couple, based on the operation mode of the transmit path, one or more of the first analog mixer circuitry, the second analog mixer circuitry and the third output node to the output of the DAC circuitry.

Another example (e.g. example 13) relates to a previously described example (e.g. any one of examples 2 to 5), wherein the first analog mixer circuitry and the second analog mixer circuitry are permanently coupled to the output of the DAC circuitry by permanent electrical connections.

Another example (e.g. example 14) relates to a previously described example (e.g. example 6 or example 7), wherein the third output node is permanently coupled to the output of the DAC circuitry by a permanent electrical connection.

Another example (e.g. example 15) relates to a previously described example (e.g. any one of examples 8 to 10), wherein the first analog mixer circuitry is permanently coupled to the output of the DAC circuitry by a permanent electrical connection.

Another example (e.g. example 16) relates to a previously described example (e.g. any one of examples 1 to 15), wherein a value of the upconverted digital baseband signal's frequency is half of a value of a sample rate of the DAC circuitry or smaller.

Another example (e.g. example 17) relates to a previously described example (e.g. example 16), wherein the value of the upconverted digital baseband signal's frequency is quarter of the value of the DAC circuitry's sample rate.

Another example (e.g. example 18) relates to a previously described example (e.g. example 16 or example 17), wherein the DAC circuitry's sample rate is at least 1 giga samples per second.

Another example (e.g. example 19) relates to a previously described example (e.g. any one of examples 1 to 18), wherein a center frequency of the digital baseband signal is 0 Hz.

Another example (e.g. example 20) relates to a previously described example (e.g. any one of examples 1 to 19), wherein the upconverted digital baseband signal is a complex signal, wherein the transmit path further comprises digital filter circuitry coupled between the digital mixer circuitry and the DAC circuitry, and wherein the digital filter circuitry is configured to filter the upconverted digital baseband signal to provide only the real part of the upconverted digital baseband signal to the DAC circuitry.

Another example (e.g. example 21) relates a semiconductor device comprising at least one receive path, the receive path comprising: a first input node for receiving an analog in-phase input signal; a second input node for receiving an analog quadrature input signal; first analog mixer circuitry coupled to the first input node and configured to generate an upconverted analog in-phase input signal by upconverting a frequency of the analog in-phase input signal; second analog mixer circuitry coupled to the second input node and configured to generate an upconverted analog quadrature input signal by upconverting a frequency of the analog quadrature input signal; combiner circuitry configured to combine the upconverted analog in-phase input signal and the upconverted analog quadrature input signal to an analog input signal; ADC circuitry coupled to the combiner circuitry and configured to generate a digital input signal based on the analog input signal; and digital mixer circuitry coupled to an output of the ADC circuitry and configured to generate a digital baseband signal by downconverting a frequency of the digital input signal.

Another example (e.g. example 22) relates to a previously described example (e.g. example 21), further comprising low-pass filter circuitry coupled to the digital mixer circuitry and configured to low-pass filter the digital baseband signal.

Another example (e.g. example 23) relates to a previously described example (e.g. example 21 or example 22), wherein a value of a frequency of the analog input signal is half of a value of a sample rate of the ADC circuitry or smaller.

Another example (e.g. example 24) relates to a previously described example (e.g. example 23), wherein the value of the analog input signal's frequency is quarter of the value of the ADC circuitry's sample rate.

Another example (e.g. example 25) relates to a previously described example (e.g. example 23 or example 24), wherein the ADC circuitry's sample rate is at least 1 giga samples per second.

Another example (e.g. example 26) relates to a previously described example (e.g. any one of examples 21 to 25), wherein a respective center frequency of the analog in-phase input signal and the analog quadrature input signal is 0 Hz.

Another example (e.g. example 27) relates to a previously described example (e.g. any one of examples 21 to 26), wherein a center frequency of the digital baseband signal is 0 Hz.

Another example (e.g. example 28) relates to a previously described example (e.g. any one of examples 21 to 27), wherein the first analog mixer circuitry is configured to upconvert the frequency of the analog in-phase input signal by a first frequency value, wherein the second analog mixer circuitry is configured to upconvert the frequency of the analog quadrature input signal by the first frequency value, and wherein the digital mixer circuitry is configured to downconvert the frequency of the digital input signal by a second frequency value, the first frequency value being equal to the second frequency value.

Another example (e.g. example 29) relates to a previously described example (e.g. any one of examples 21 to 28), further comprising: a third input node for receiving a RF input signal; and switching circuitry configured to selectively couple, based on an operation mode of the receive path, the combiner circuitry or the third input node to the ADC circuitry, wherein the ADC circuitry is configured to generate the digital input signal based on the RF input signal instead of the analog input signal in case the third input node is coupled to the ADC circuitry.

Another example (e.g. example 30) relates to a transceiver comprising a first semiconductor device according to a previously described example (e.g. one of examples 1 to 20) and a second semiconductor device according to a previously described example (e.g. one of examples 21 to 29).

Another example (e.g. example 31) relates to a previously described example (e.g. example 30), wherein the first semiconductor device and the second semiconductor device are implemented integrally.

Another example (e.g. example 32) relates to a base station comprising a transceiver according to a previously described example (e.g. example 30 or example 31) and at least one antenna coupled to transceiver.

Another example (e.g. example 33) relates to a previously described example (e.g. example 32), further comprising analog front-end circuitry coupled between the transceiver and the at least one antenna.

Another example (e.g. example 34) relates to a mobile device comprising a transceiver according to a previously described example (e.g. example 30 or example 31) and at least one antenna coupled to transceiver.

Another example (e.g. example 35) relates to a previously described example (e.g. example 34, further comprising analog front-end circuitry coupled between the transceiver and the at least one antenna.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A semiconductor device comprising at least one transmit path, the transmit path comprising:
   an input node for receiving a digital baseband signal;
   digital mixer circuitry coupled to the input node and configured to generate an upconverted digital baseband signal by upconverting a frequency of the digital baseband signal;
   Digital-to-Analog Converter, DAC, circuitry coupled to the digital mixer circuitry and configured to generate an analog radio frequency signal based on the upconverted digital baseband signal;
   first analog mixer circuitry coupleable to an output of the DAC circuitry;
   second analog mixer circuitry coupleable to the output of the DAC circuitry;
   a first output node coupleable to an output of the first analog mixer circuitry; and
   a second output node coupleable to an output of the second analog mixer circuitry.

2. The semiconductor device of claim 1, wherein:
   the first analog mixer circuitry and the second analog mixer circuitry are coupled to the output of the DAC circuitry and each configured to receive the analog radio frequency signal,
   the first output node is coupled to the output of the first analog mixer circuitry,
   the second output node is coupled to the output of the second analog mixer circuitry,
   the first analog mixer circuitry is configured to generate an in-phase output signal by downconverting a frequency of the analog radio frequency signal to a frequency of the digital baseband signal, and
   the second analog mixer circuitry is configured to generate a quadrature output signal by downconverting the frequency of the analog radio frequency signal to the frequency of the digital baseband signal, the in-phase output signal and the quadrature output signal being phase-shifted by 90° with respect to each other.

3. The semiconductor device of claim 2, wherein the first analog mixer circuitry is configured to downconvert the frequency of the analog radio frequency signal using a first oscillation signal, and wherein the second analog mixer circuitry is configured to downconvert the frequency of the analog radio frequency signal using a second oscillation signal, the first oscillation signal and the second oscillation signal being phase-shifted by 90° with respect to each other.

4. The semiconductor device of claim 2, wherein a frequency of the in-phase output signal and a frequency of the quadrature output signal are equal to a frequency of the digital baseband signal, or wherein the digital mixer circuitry is configured to upconvert the frequency of the digital baseband signal by a first frequency value and the first and the second analog mixer circuitries are both configured to downconvert the frequency of the analog radio frequency signal by a second frequency value, the first frequency value being equal to the second frequency value.

5. The semiconductor device of claim 1, further comprising a third output node coupled to the output of the DAC circuitry, wherein:
   the third output node is configured to output the analog radio frequency signal, and
   the first analog mixer circuitry and the second analog mixer circuitry are decoupled from the output of the DAC circuitry.

6. The semiconductor device of claim 5, wherein the first output node is decoupled from the output of the first analog mixer circuitry, and wherein the second output node is decoupled from the output of the second analog mixer circuitry.

7. The semiconductor device of claim 1, wherein the first analog mixer circuitry is coupled to the output of the DAC circuitry, wherein the first output node is coupled to the output of the first analog mixer circuitry, and wherein the first analog mixer circuitry is configured to:
   receive the analog radio frequency signal; and
   generate an analog radio frequency output signal by upconverting a frequency of the analog radio frequency signal.

8. The semiconductor device of claim 7, wherein the second analog mixer circuitry is decoupled from the output of the DAC circuitry.

9. The semiconductor device of claim 1, further comprising switching circuitry configured to selectively couple, based on an operation mode of the transmit path, one or more of the first analog mixer circuitry and the second analog mixer circuitry to the output of the DAC circuitry.

10. The semiconductor device of claim 2, wherein the first analog mixer circuitry and the second analog mixer circuitry are permanently coupled to the output of the DAC circuitry by permanent electrical connections.

11. The semiconductor device of claim 7, wherein the first analog mixer circuitry is permanently coupled to the output of the DAC circuitry by a permanent electrical connection.

12. The semiconductor device of claim 1, wherein a value of the upconverted digital baseband signal's frequency is half of a value of a sample rate of the DAC circuitry or smaller.

13. The semiconductor device of claim 2, wherein the value of the upconverted digital baseband signal's frequency is quarter of the value of the DAC circuitry's sample rate.

14. The semiconductor device of claim 12, wherein the DAC circuitry's sample rate is at least 1 giga samples per second.

15. The semiconductor device of claim 1, wherein a center frequency of the digital baseband signal is 0 Hz.

* * * * *